United States Patent [19]
Lin

[11] Patent Number: 6,109,947
[45] Date of Patent: Aug. 29, 2000

[54] ZIF SOCKET WITH SINGLE-POINT DRIVING MECHANISM

[75] Inventor: Nick Lin, Hsin-Chuang, Taiwan

[73] Assignee: Hon Hai Precision Ind. Co., Ltd., Taipei Hsien, Taiwan

[21] Appl. No.: 09/295,479

[22] Filed: Apr. 19, 1999

[51] Int. Cl.[7] .............................. H01R 4/50; H01R 13/625
[52] U.S. Cl. ................................................................. 439/342
[58] Field of Search ..................................... 439/342, 259, 439/263, 268

[56] References Cited

U.S. PATENT DOCUMENTS 5,730,615 3/1998 Lai et al. ............................... 439/342

Primary Examiner—Lincoln Donovan
Assistant Examiner—Javaid Nasri
Attorney, Agent, or Firm—Wei Te Chung

[57] ABSTRACT

An electrical socket comprising a rectangular base having a first arm extending from one corner thereof, a first space region defined in the first arm, a rectangular cover movably engaged with the base within a movable distance and having a second arm extending from one corner thereof, and a second space region defined in the second arm. The first space region and the second space region are simultaneously insertable by an external screw driver thereby driving the cover to move with respect to the base along a diagonal direction thereto.

14 Claims, 5 Drawing Sheets

ZIF SOCKET WITH SINGLE-POINT DRIVING MECHANISM

BACKGROUND OF THE INVENTION

1. Field of the Invention

The present invention relates to a zero insertion force socket having a cover movable with respect to a base thereof, particularly one which has a single-point driving mechanism for moving the cover with respect to the base.

2. The Prior Art

Zero insertion force (ZIF) sockets have been used to connect a CPU to a printed circuit board for years. Normally, this socket needs a relatively long pitch for accommodating a lead-in distance of each contact which allows a corresponding CPU pin to be inserted into the socket with substantially zero insertion force firstly and then moved by a cover of the socket for this lead-in distance to abut against contacting portion of the contact in the socket. These sockets may be referred to U.S. Pat. Nos. 5,057,031 and 5,730,615. For effectively utilizing the space of the socket and lowering the profile thereof the inventor of the present invention has proposed a low profile socket in U.S. application Ser. No. 09/146,998 which arranges the moving direction of the cover of the socket in a diagonal line and the normal actuation mechanism including the cam and the lever being omitted for space conservation. Although this configuration works well, it still needs two points for driving the cover to move with respect to the base in opposite directions, i.e., to drive the socket between an open status and a close status. With two driving points, two operational spaces nearby the driving points have to be preserved, and this violates the compact size trend in the manufacture of a personal computer especially a note book computer. It is requisite to provide a new socket with single-point driving mechanism for conserving space.

SUMMARY OF THE INVENTION

The primary purpose of the present invention is to provide an improved low profile socket having a single-point driving mechanism for conserving operational space.

In accordance with one aspect of the present invention, an electrical socket comprising a rectangular base having a first arm extending from one corner thereof, a first space region defined in the first arm and first opposite inner wall portions on the first arm being spaced by the first space region, a rectangular cover movably engaged with the base within a movable distance and having a second arm extending from one corner thereof, and a second space region defined in the second arm and second opposite inner wall portions formed in the second arm being spaced by the second space region. The first space region and the second space region are simultaneously insertable by an external screw driver thereby driving the cover to move with respect to the base along a diagonal direction thereof, with a first portion of the screw driver abutting against one of the first opposite inner wall portions of the first arm and a second portion of the screw driver abutting against one of the second opposite inner wall portions of the second arm.

DETAILED DESCRIPTION OF THE PREFERRED EMBODIMENT

Figure 1:
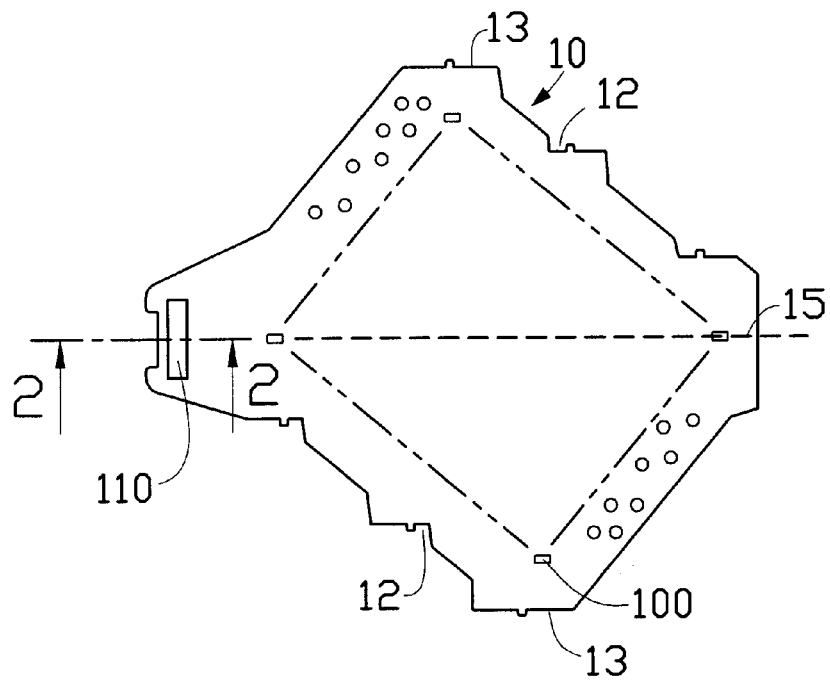
FIG. 1 is an elevational view of a base used in the socket of the present invention.
Figure 3:
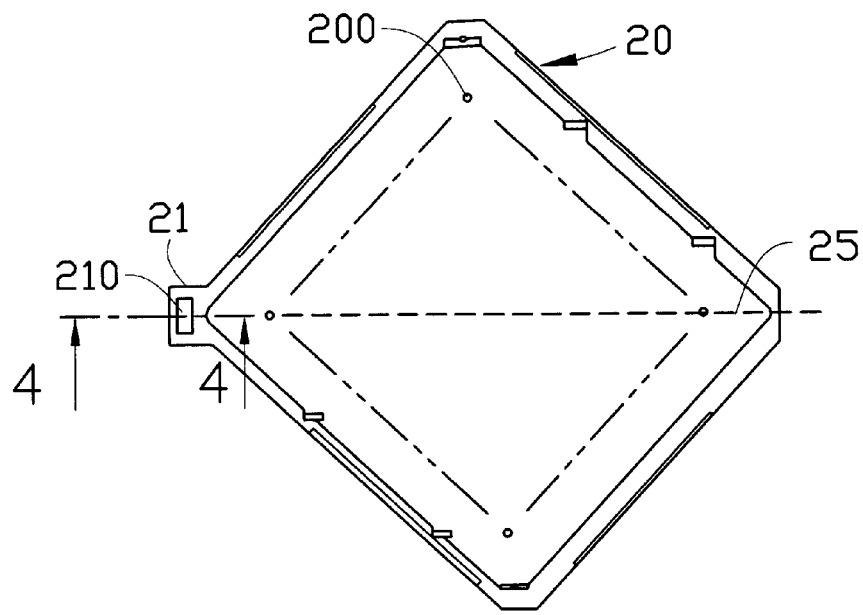
FIG. 3 is an elevational view of a cover used in the socket of the present invention.
Figure 5:
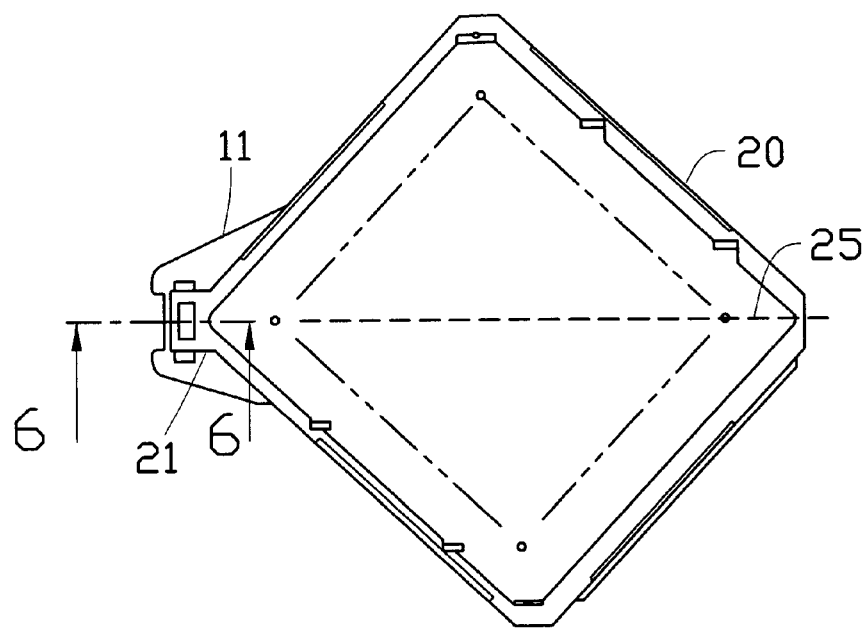
FIG. 5 is an assembled view of FIGS. 1 and 3.

Referring to FIGS. 1, 3, and 5, a diagonal movable socket in accordance with the present invention comprises an insulative rectangular base 10 and an insulative rectangular cover 20 movably engaged with the base 10. The base 10 defines a plurality of holes 200 for receiving contacts (not shown) therein. The cover 20 also defines a plurality of holes 200 for receiving and guiding pins of a CPU module to be originally inserted into the contacts with substantially zero insertion force and then driven by the cover 20 to firmly retained in the contacts. The detailed of the contacts may be referred to U.S. patent application Ser. No. 09/146,998 which is assigned to the same assignee of the present invention and the inventor of this invention is one of the co-inventors thereof. The base 10 has two right-angled triangular cutouts 12 formed in each of two opposite sides thereof and each triangular cutout.

The cover 20 has triangular protrusions (not shown) projecting downward from a bottom surface thereof for correspondingly movably engaging with the triangular cutouts 12 of the base 10. Moreover, the base 10 has a first pair of opposite corners 13 each of which has a chamfer plane substantially parallel to a diagonal line 15 of the other pair of corners. The cover 20 has corresponding protrusions (not shown) projecting downward from opposite corners thereof and substantially symmetric to a diagonal line 25 thereof for movably engaging with the chamfer planes of the first pair of corners 13 of the base 10. The diagonal lines 15 and 25 of the base 10 and the cover 20 are substantially parallel to each other. The detailed of the engagement and movement between the cover 20 and the base 10 may also be referred to U.S. patent application Ser. No. 09/146,998.

The above description is only the schematic structures of the base 10 and the cover 20 which are not the feature of the present invention. The feature of the present invention is in the single-point driving structure of the connector and it will be described subsequently.

Figure 2:
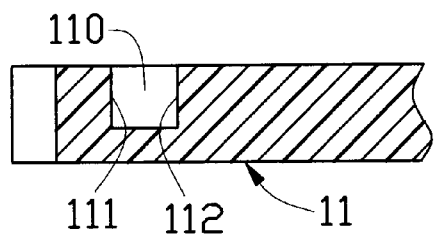
FIG. 2 is a cross-sectional view taken from line 2—2 of FIG. 1.
Figure 4:
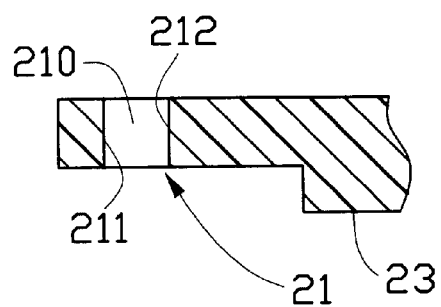
FIG. 4 is a cross-sectional view taken from line 4—4 of FIG. 3.

The base 10 has a first arm 11 extending from one corner thereof substantially along the diagonal line 15. Also referring to FIG. 2, a groove 110 is defined in the first arm 11 and thus defines a first pair of opposite walls 111 and 112 spaced by the groove 110. Also referring to FIG. 4, the cover 20 has a second arm 21 extending from one corner thereof substantially along the diagonal line 25 and the second arm 21 is offset from a bottom surface 23 of the cover 20 with a distance. A hole 210 is formed in the second arm 21 and thus defines a second pair of opposite walls 211 and 212 spaced by the hole 210.

Figure 6:
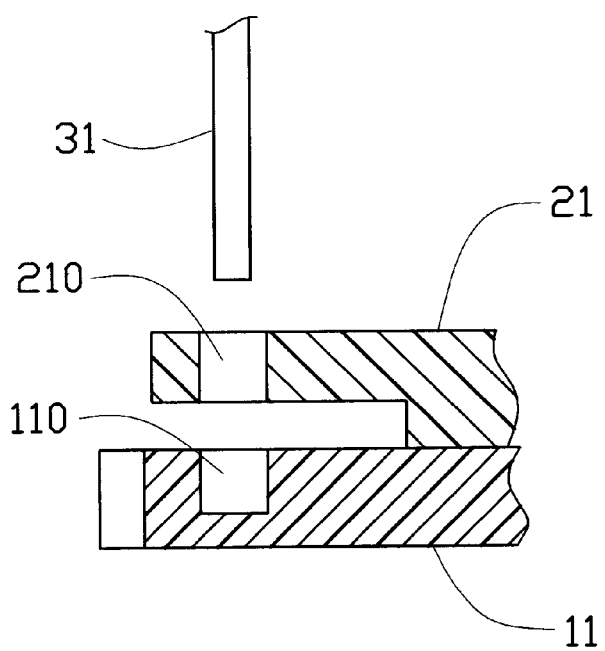
FIG. 6 is a cross-sectional view taken from line 6—6 of FIG. 5.

Particularly referring to FIGS. 5 and 6, the cover 20 is movably engaged with the base 10, with the hole 210 of the cover 20 having at least a portion in alignment with at least a portion of the groove 110 of the base 10 during relative movement therebetween. A screwdriver 31 or the like may be inserted into the hole 210 and the groove 110 for driving the cover 20 to move with respect to the base 10 in opposite directions along the diagonal line 25.

Figure 7:
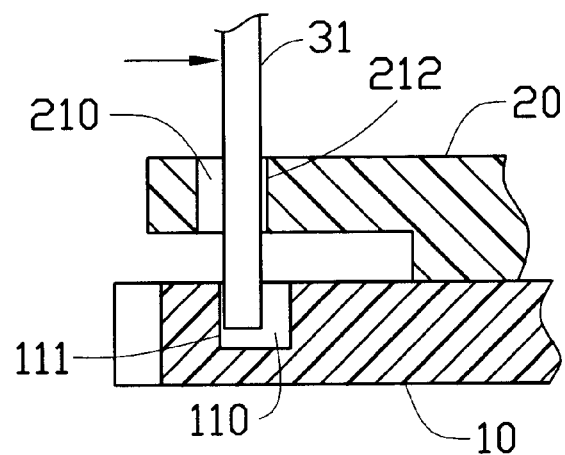
FIG. 7 is an operational view of FIG. 6.
Figure 8:
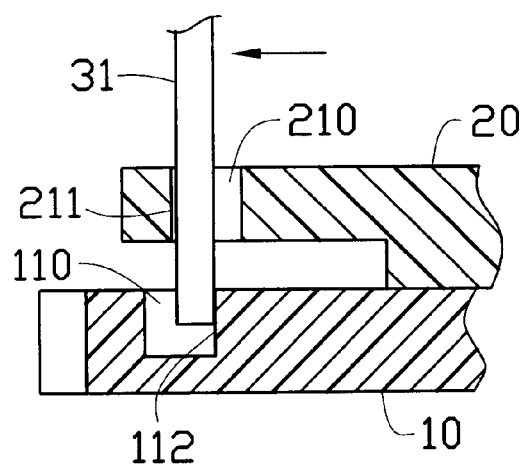
FIG. 8 is another operational view of FIG. 6.

FIGS. 7 and 8 respectively illustrate opposite moving directions between the cover 20 and the base 10. Specifically referring to FIG. 7, a first portion of the screwdriver 31 abuts against the inner wall 212 of the cover 20 and a second portion of the screwdriver 31 abuts against the inner wall 111 of the base 10, thus when the screwdriver is driven in a first direction as shown by an arrow, the cover 20 will be moved along the first direction and the physical relation between the cover 20 and the base 10 will be changed to that shown in FIG. 8.

Similarly, in FIG. 8, the screwdriver 31 maybe inserted into the hole 210 and the groove 110, with a first portion of the screwdriver 31 abuts against the inner wall 211 of the cover 20 and a second portion of the screwdriver 31 abuts against the inner wall 112 of the base 10, thus when the screwdriver 31 is driven in a second direction as shown by an arrow, the cover 20 will be moved along the second direction and the physical relation between the cover 20 and the base 10 will be changed to that shown in FIG. 7.

With the above single-point driving structure, the cover 20 may be driven in opposite directions along the diagonal line 25 thereby facilitating the socket in either open status or closed status.

Figure 9:
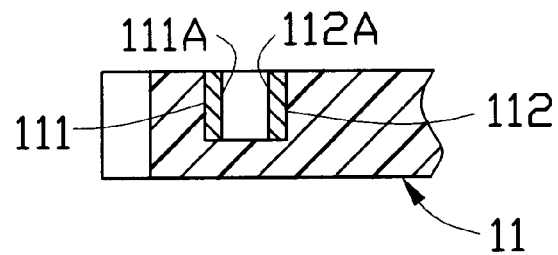
FIG. 9 is a schematic sectional view of the base in a second embodiment of the present invention.
Figure 10:
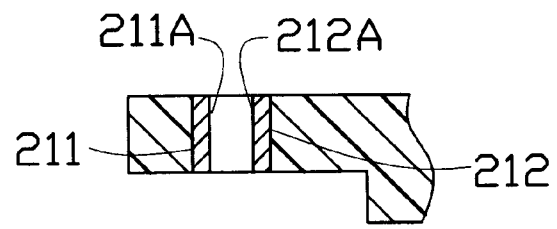
FIG. 10 is a schematic sectional view of the cover in a second embodiment of the present invention.

In a second embodiment as shown in FIGS. 9 and 10, metal plates 111A, 112A may be fixed to the inner walls 111, 112 respectively for reinforcement purpose preventing the inner walls 111, 112 from being damaged by the screwdriver 31. Similarly, metal plates 211A, 212A may be fixed to the inner walls 211, 212 for reinforcement purpose preventing the inner walls 211, 212 from being damaged by the screwdriver 31.

It is appreciated that because the second arm 21 is spaced from the bottom surface 23 of the cover 20 and naturally is spaced from the base 11, the groove 110 of the base 11 is substantially suspensible and spaced from the hole 210 of the cover 20. Thus, the operation of the screwdriver 31 within both the groove 110 of the base 11 and the hole 210 of the cover 20 can be smooth without redundant frictions thereabout thereby assuring easy actuation thereof. Additionally, because this actuation occurs along the diagonal line 25 of the socket, it can efficiently balance the resistance forces due to the engagement between the contacts of the socket and the pins of the CPU, thus allowing a smooth and gradual stress dispersion along the whole process of this actuation.

While the present invention has been described with reference to a specific embodiment, the description is illustrative of the invention and is not to be construed as limiting the invention. For example, the metal plates 111A, 112A may be a portion of a metal frame directly engaged with the corner of the base 10. Similarly, the metal plates 211A, 212A may be a portion of another metal frame directly engaged with the corner of the cover 10.

Therefore, various modifications to the present invention can be made to the preferred embodiment by those skilled in the art without departing from the true spirit and scope of the invention as defined by the appended claims.

What is claimed is:

1. An electrical socket comprising:
   a rectangular base having first arm extending from one corner thereof;
   a first space region defined in the first arm and first opposite inner wall portions on the first arm being spaced by the first space region;
   a rectangular cover movably engaged with the base within a movably distance and having a second arm extending from one corner thereof;
   a second space region defined in the second arm and second opposite inner wall portions formed in the second arm being spaced by the second space region;
   wherein the first space region is vertically spaced from the second space region with a predetermined distance, the first space region and the second space region are simultaneously insertable by an external screw driver thereby driving the cover to move with respect to the base along a diagonal direction thereof, with a first portion of the screw driver abutting against one of the first opposite inner wall portions of the first arm and a second portion of the screw driver abutting against one of the second opposite inner wall portions of the second arm.

2. The electrical socket as claimed in claim 1, wherein the first space region is a groove.

3. The electrical socket as claimed in claim 1, wherein the second space region is a hole.

4. The electrical socket as claimed in claim 1, wherein at least one of the first opposite inner wall portions is made of metal.

5. The electrical socket as claimed in claim 1, wherein at least one of the second opposite inner wall portions is made of metal.

6. A electrical socket comprising:
   a rectangular base having a first reception member at a corner thereof;
   a rectangular cover movably engaged with the base and having a second reception member formed at a corner thereof, the cover being movable along a diagonal line of the base when the cover is moved with respect to the base;
   wherein the first reception member is vertically spaced from the second reception member with a predetermined distance, the first reception member has at least a portion vertically in alignment with a portion of the second reception member when the cover is moved with respect to the base.

7. The electrical socket as claimed in claim 6, wherein the first reception member is a groove.

8. The electrical socket as claimed in claim 7, wherein the second reception member is a hole.

9. The electrical socket as claimed in claim 6, wherein the corner formed with the first reception member is a metal frame firmly connected to the rectangular base.

10. The electrical socket as claimed in claim 9, wherein the first reception member is a groove.

11. The electrical socket as claimed in claim 6, wherein the corner formed with the second reception member is a metal frame firmly connected to the rectangular cover.

12. The electrical socket as claimed in claim 11, wherein the second reception member is a hole.

13. An electrical socket comprising:
   a rectangular base having a first arm extending from one corner thereof and a first space region defined in the first arm;
   a rectangular cover movably engaged with the base within a movable distance and having a second arm extending from one corner thereof; and
   a second spaced region defined in the second arm and being vertically spaced from the first space region with a predetermined distance; and wherein the first space region and the second space region are simultaneously insertable by an external screw driver thereby driving the cover to move with respect to the base along a diagonal direction thereof.

14. An electrical socket comprising:

a base including a first space region positioned on a first diagonal line thereof; and a cover including a second space region positioned on a second diagonal line thereof; wherein the first space region and the second space region are vertically spaced from the first space region with a predetermined distance and adapted to allow an external tool to engage both the first space region and the second space region and then simultaneously to actuate the cover to move along the second diagonal line with regard to the base.

* * * * *